(12) United States Patent
Bajaj et al.

(10) Patent No.: US 8,450,792 B2
(45) Date of Patent: May 28, 2013

(54) STRUCTURE AND FABRICATION METHOD OF TUNNEL FIELD EFFECT TRANSISTOR WITH INCREASED DRIVE CURRENT AND REDUCED GATE INDUCED DRAIN LEAKAGE (GIDL)

(75) Inventors: Mohit Bajaj, Bangalore (IN); Kota V. R. M. Murali, Bangalore (IN); Edward J. Nowak, Essex Junction, VT (US); Rajan K. Pandey, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 97 days.

(21) Appl. No.: 13/082,867

(22) Filed: Apr. 8, 2011

(65) Prior Publication Data

US 2012/0256248 A1    Oct. 11, 2012

(51) Int. Cl.
*H01L 29/792* (2006.01)

(52) U.S. Cl.
USPC .......................................... 257/324; 438/478

(58) Field of Classification Search
USPC .................. 257/324, 347, 350; 438/197, 478, 438/479
See application file for complete search history.

(56) References Cited

U.S. PATENT DOCUMENTS

| | | | |
|---|---|---|---|
| 5,698,893 A | 12/1997 | Perera et al. | |
| 6,979,622 B1 | 12/2005 | Thean et al. | |
| 7,087,477 B2 | 8/2006 | Fried et al. | |
| 7,205,639 B2 | 4/2007 | Hierlemann et al. | |
| 7,317,230 B2 | 1/2008 | Lee et al. | |
| 7,365,401 B2 | 4/2008 | Anderson et al. | |
| 7,396,407 B2 | 7/2008 | Saenger et al. | |
| 7,439,542 B2 | 10/2008 | Yang | |
| 7,485,524 B2 | 2/2009 | Luo et al. | |
| 7,524,733 B2 | 4/2009 | Seo et al. | |
| 7,867,836 B2 * | 1/2011 | Nonaka et al. | 438/197 |
| 7,872,315 B2 * | 1/2011 | Takahashi | 257/393 |
| 8,217,427 B2 * | 7/2012 | Chuang et al. | 257/206 |
| 8,241,928 B2 * | 8/2012 | Lee et al. | 438/18 |
| 2009/0045454 A1 * | 2/2009 | Takaya et al. | 257/324 |

OTHER PUBLICATIONS

Sanuki et al., "New Stress Inducing Technique of Epitaxial si on Recessed S/D Fabricated in Substrate Strained-Si of <100>-Channel on Rotated Wafers", IEEE 2005.

* cited by examiner

*Primary Examiner* — Nathan Ha
(74) *Attorney, Agent, or Firm* — Hoffman Warnick LLC; Michael J. LeStrange

(57) ABSTRACT

Gate induced drain leakage in a tunnel field effect transistor is reduced while drive current is increased by orienting adjacent semiconductor bodies, based on their respective crystal orientations or axes, to optimize band-to-band tunneling at junctions. Maximizing band-to-band tunneling at a source-channel junction increases drive current, while minimizing band-to-band tunneling at a channel-drain junction decreases GIDL. GIDL can be reduced by an order of magnitude in an embodiment. Power consumption for a given frequency can also be reduced by an order of magnitude.

20 Claims, 14 Drawing Sheets

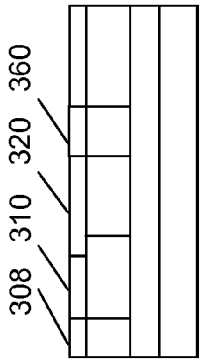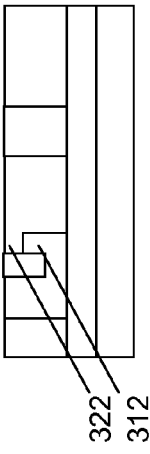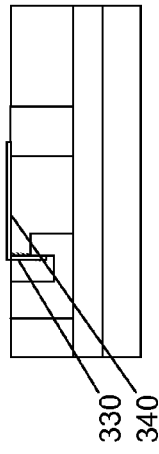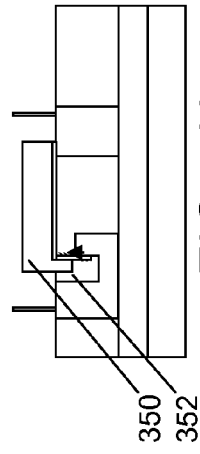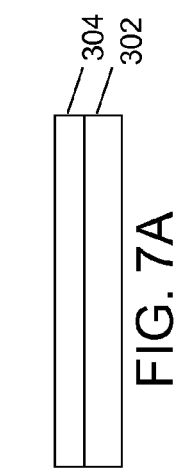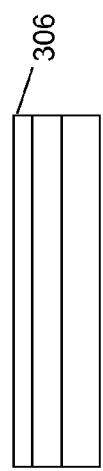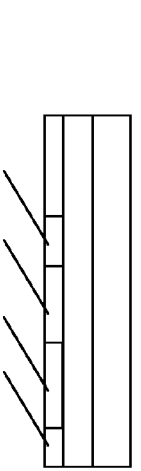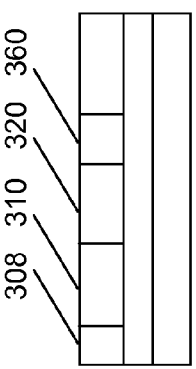

STRUCTURE AND FABRICATION METHOD OF TUNNEL FIELD EFFECT TRANSISTOR WITH INCREASED DRIVE CURRENT AND REDUCED GATE INDUCED DRAIN LEAKAGE (GIDL)

BACKGROUND

The present invention relates to semiconductor devices and, more specifically, to an improved tunnel field effect transistor with increased drive current and reduced gate induced drain leakage (GIDL).

As semiconductor devices continue to be scaled down in size, aspects of their components suffer performance degradation due to physical effects. Transistors, such as field effect transistors (FETs), typically suffer from a fundamental thermodynamic limit in the subthreshold swing, given by the thermal voltage, $kT/Qe$, where k is the Boltzmann constant, T is the absolute temperature of the transistor, and Qe is the quantum of electric charge. This swing in turn places a floor on the threshold voltage of transistors, and hence a limitation in power-supply voltage scaling. In semiconductors, the highest mobility and the highest tunnel rates do not occur in the same crystal orientation and direction. An example of a typical prior art FET 100 is shown in FIG. 1 and includes a substrate 110 connected to a ground, a source 120, a drain 130, and a gate 140. The source 120 and drain 130 each include a source region 122 and a drain region 132 formed in the substrate 110, such as by doping, and are connected to respective power supplies 124, 134. A gate 140 includes a layer of insulator 142 deposited over a channel region 150 of the substrate. The gate is connected to a gate power supply 144 such that, for an n-p-n transistor, when a potential is applied to the gate 140, the channel is narrowed or closed. The drive current of the FET is limited by the effective mass of the charge carriers and carrier scattering along a particular crystal orientation along the source-to-drain direction. Also, a gate induced drain leakage (GIDL) 160 arises from electrons tunneling when a gate voltage is applied. The magnitudes of the drive and GIDL currents depend on applied voltage, insulator thickness, materials employed, ambient and operating temperatures, and other factors.

Recently, a class of transistors based on tunnel generation of channel carriers at the source has been explored. These tunnel field effect transistors may demonstrate subthreshold swings in excess of $kT/Qe$ by employing band-to-band tunneling for generation of the channel current, thereby avoiding the thermodynamic limitation imposed on conventional FETs.

For a tunnel field effect transistor built in a crystalline semiconductor, it is advantageous to choose a crystal orientation which maximizes the tunneling rate for generation of channel carriers, and it is further desirable to choose a crystal plane and orientation which maximizes the mobility of the channel carriers. In most crystalline semiconductors, however, the plane and direction offering the highest tunnel rates do not coincide with the plane and direction offering the highest channel mobility. Thus, there is a need for an improved tunnel field effect transistor with both high tunnel rates and high channel mobility.

As indicated above, drive current is maximized along the crystal orientation which has the lowest effective mass of charge carriers. Though this maximizes drive current, GIDL current also increases dramatically for transistors of a scale below about 50 nm. GIDL current grows exponentially as scale decreases such that GIDL becomes a significant problem, interfering with operation of the transistor and/or requiring more power to operate the transistor. Current designs, therefore, may not provide increased drive current while providing reduced GIDL currents. Increases in required power are a problem since the trend in device miniaturization is to demand lower power consumption, for example, to reduce heat output and, in the case of mobile devices, increase battery life. Thus, there is a need for a transistor with high on/drive current but with lower GIDL, particularly for transistors on a scale of less than about 50 nm and/or to allow higher operating frequencies.

SUMMARY

According to one embodiment of the present invention, a tunnel field effect transistor comprises a source region, a channel region, a gate region, and a drain region. The channel region is connected to the source region and the drain region. A first semiconductor body of one of the source region, the channel region, and the drain region has a first semiconductor material crystal axis, and a second semiconductor body of another of the source region, the channel region, and the drain region has a second crystal material crystal axis. A first transition region includes at least a first junction that is a respective one of a source-channel junction and a channel-drain junction. The first semiconductor body and the second semiconductor body are arranged such that the first semiconductor material crystal axis is oriented at a first predetermined angle relative to the second semiconductor material axis to optimize band-to-band tunneling during operation of the transistor.

In another embodiment, a method of fabricating a tunnel field effect transistor includes providing a semiconductor substrate and defining a device region. A channel semiconductor body is formed in the device region with a source-end portion, a drain-end portion, and at least one gate surface. One of a source region and a drain region is formed and includes a channel-end portion adjacent a respective channel end portion, which forms a junction. The channel-end portion of the one of a source region and a drain region has a first semiconductor material crystal axis, and respective channel end portion has a second semiconductor material crystal axis oriented at a first predetermined angle relative to the first semiconductor material crystal axis so as to optimize band-to-band tunneling at the junction during operation of the transistor.

Another embodiment of the invention includes a method of making a tunnel field effect transistor in which a substrate having a work surface is provided. A fin is formed on the work surface, the fin having a source region including a channel-end portion with a first semiconductor material crystal axis. A channel region of the fin is formed adjacent the source region, which also forms a source-channel junction between the source region and the channel region. The source-end portion of the channel region has a second semiconductor material axis that is oriented at a first predetermined angle relative to the first semiconductor material crystal axis, the first predetermined angle being determined to maximize band-to-band tunneling of the source-channel junction during operation of the transistor. A tunnel dielectric is deposited on at least a portion of the source region, and a channel dielectric is deposited on at least a portion of the channel region of the fin. Gate material is deposited on the tunnel and channel dielectrics to form a gate region.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

FIGS. 7A-7H schematically illustrate stages of fabrication of a tunnel field effect transistor, such as that shown in FIGS. 3-6, according to an embodiment.

DETAILED DESCRIPTION

Figure 1:
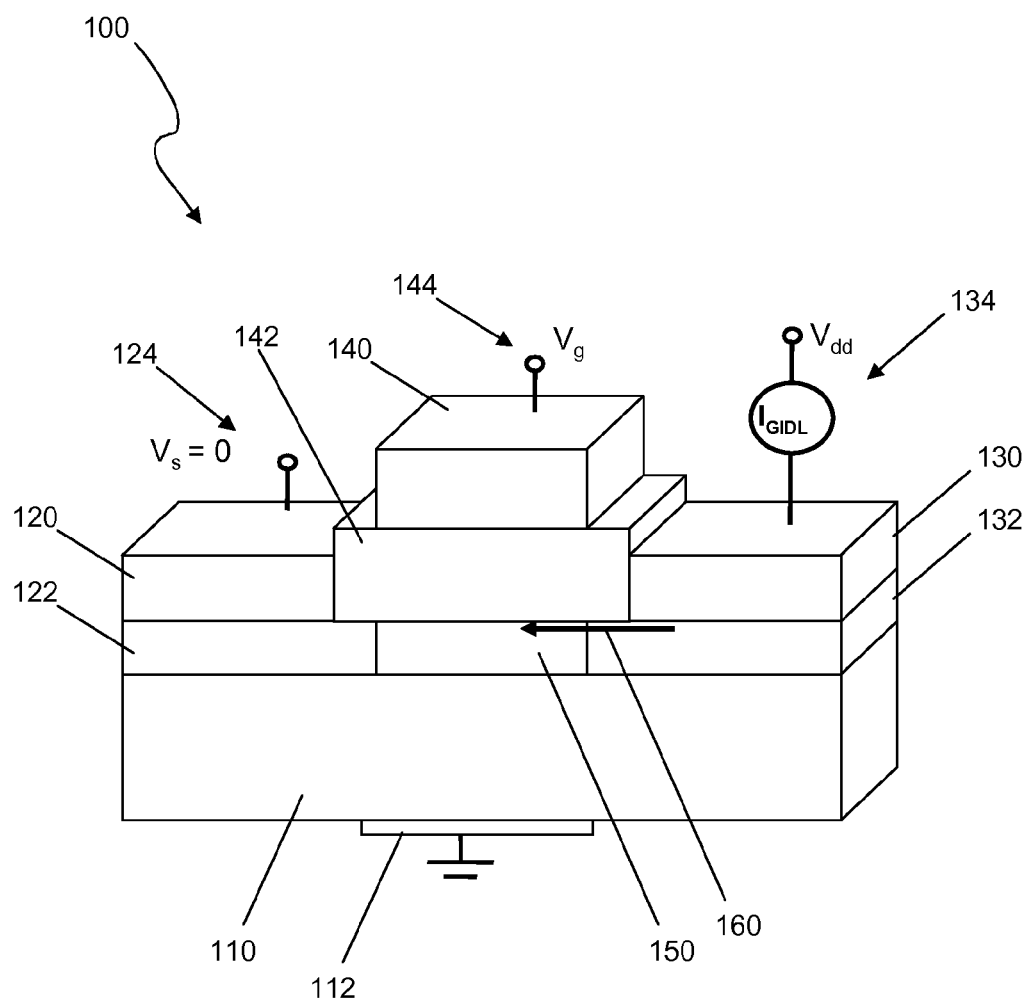
FIG. 1 is a schematic diagram of a typical prior art field effect transistor.
Figure 2:
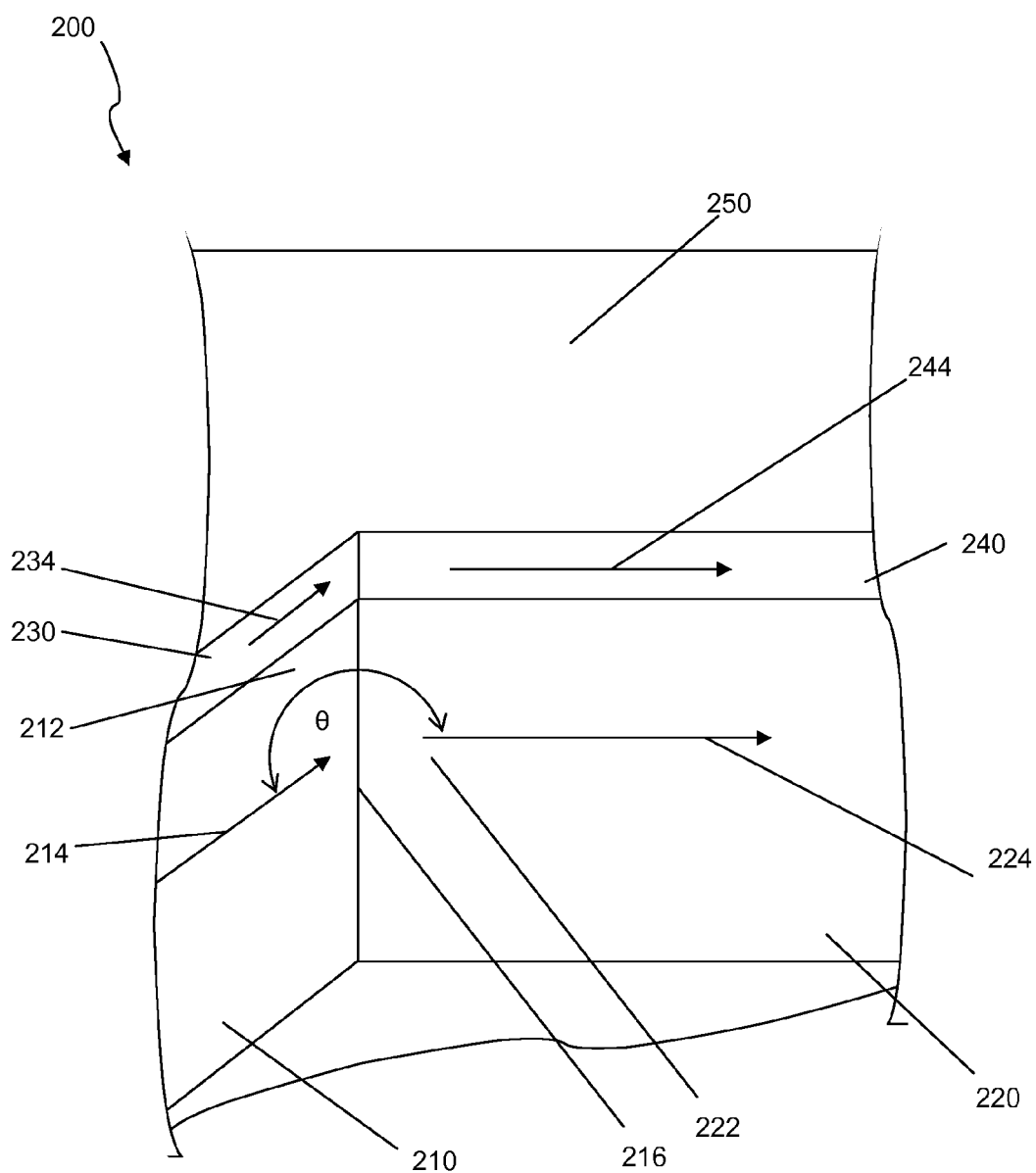
FIG. 2 is a side schematic diagram of a generalized transition region of a tunnel field effect transistor according to an embodiment.

According to embodiments, transition regions of a tunnel field effect transistor are arranged to optimize band-to-band tunneling for the particular transition region. For example, as seen in FIG. 2, a portion of a tunnel field effect transistor 200 includes a first region 210 with a first semiconductor body 212 arranged adjacent a second region 220 with a second semiconductor body 222. A first dielectric 230 overlies at least part of first region 210, and a second dielectric overlies at least part of second region 220, at least one of first and second dielectrics 230, 240 separating at least part of a gate region 250 from at least part of first region 210 and/or part of second region 220.

First semiconductor body 212 is made from a first semiconductor material with a first semiconductor material crystal axis or crystal axis 214, and second semiconductor body 222 is made from a second semiconductor material with a second semiconductor material crystal axis or crystal axis 224. In addition, first dielectric 230 has a first dielectric axis 234 and second dielectric 240 has a second dielectric axis 244. First and second semiconductor bodies 212, 222 abut in a transition region 215, end surfaces of each body 212, 222 forming a transition junction 216 that in embodiments is substantially planar. To optimize band-to-band tunneling, first crystal axis 214 is oriented at a first angle $\theta$ relative to second crystal axis 224. When transition region 215 is a source-channel region, first angle $\theta$ is selected to provide more band-to-band tunneling, resulting in higher drive current. When transition region 215 is a channel-drain region, first angle $\theta$ is selected to provide less band-to-band tunneling, resulting in lower GIDL. In particular, band-to-band tunneling in a source-channel region may be maximized, while band-to-band tunneling in a channel-drain region may be minimized.

FIGS. 3-6 show an example of a tunnel field effect transistor 300 which, according to embodiments, may be formed on a substrate, such as a silicon-on-insulator substrate with a silicon layer 302 and a buried insulator layer 304. Insulator layer 304 as shown is a buried oxide (BOX) layer, such as silicon dioxide, but other insulators could be used. In embodiments, a body layer 306 of semiconductor material is deposited on BOX layer 304, providing material from which components of the transistor may be made, though more complex manners of forming components may also be used. Isolation regions 308 are formed, such as by using shallow trench isolation, and define a device region. While a silicon on insulator (SOI) wafer is employed as the substrate in this example, any suitable substrate may be used within the scope of embodiments. Similarly, while shallow trench isolation is the technique used to form the isolation regions in this example, other techniques may be used.

In the device region of the example shown in FIGS. 3-6, tunnel field effect transistor 300 may include a source region 310 and a channel region 320 adjacent source region 310. A tunnel dielectric 330 and a channel dielectric 340 in embodiments separate a gate region 350 from at least a portion of source region 310 and at least a portion of channel region 320. A drain region 360 may be formed adjacent an end of channel region 320 opposite an end adjacent source region 310. Source region 310 and/or drain region 360 may be formed in the device region using any suitable technique, such as by doping semiconductor material in body layer 306. Vias or leads 311, 361 may connect source region 310 and drain region 360 to respective power sources. Part of channel dielectric 340 and/or gate region 350 may lie over at least a part of drain region 360 in embodiments.

Source-channel region 315 may be defined around a source-channel junction 316, which may be a substantially planar contact surface where ends of source region 310 and channel region 320 meet. Source-channel region 315 may include a channel-end portion 312 of source region 310 and a source-end portion 322 of channel region 320. In addition, source-channel region 315 may include at least a portion of tunnel dielectric 330, channel dielectric 340, and/or gate region 350.

Similarly, a channel-drain region 325 may be defined around a channel-drain junction 366, which may be a substantially planar contact surface where ends of channel region 320 and drain region 360 meet. Channel-drain region 325 may include a drain-end portion 326 of channel region 320 and a channel-end portion 362 of drain region 360.

In the example shown in FIGS. 3-6, with particular attention to source-channel region 315 shown in more detail in FIG. 4, a portion 352 of gate region 350 extends below the body surface to cover a portion of tunnel dielectric 330. Tunnel dielectric 330 thus extends along at least portions of surfaces of source and channel regions 310, 320. In embodiments, therefore, portions of gate region 350 and tunnel dielectric 330 overlying, for example, source channel-end 312 and channel drain-end 322 may be construed as part of source-channel region 315. Similarly, channel dielectric 340 extends along at least portions of surfaces of channel and drain regions 320, 360. Thus, in embodiments, portions of channel dielectric 340 extending over, for example, channel drain-end portion 328 and drain channel-end portion 362 may be construed as part of channel-drain region 325. Gate region 350 may be made from any suitable material, including semiconductors, metals, or other materials now known and/or later developed, derived, and/or discovered. Similarly, tunnel and channel dielectrics 330, 340 may be made from, for example, silicon dioxide or any other appropriate dielectric material or insulator now known and/or later developed, derived, and/or discovered.

Figure 3:
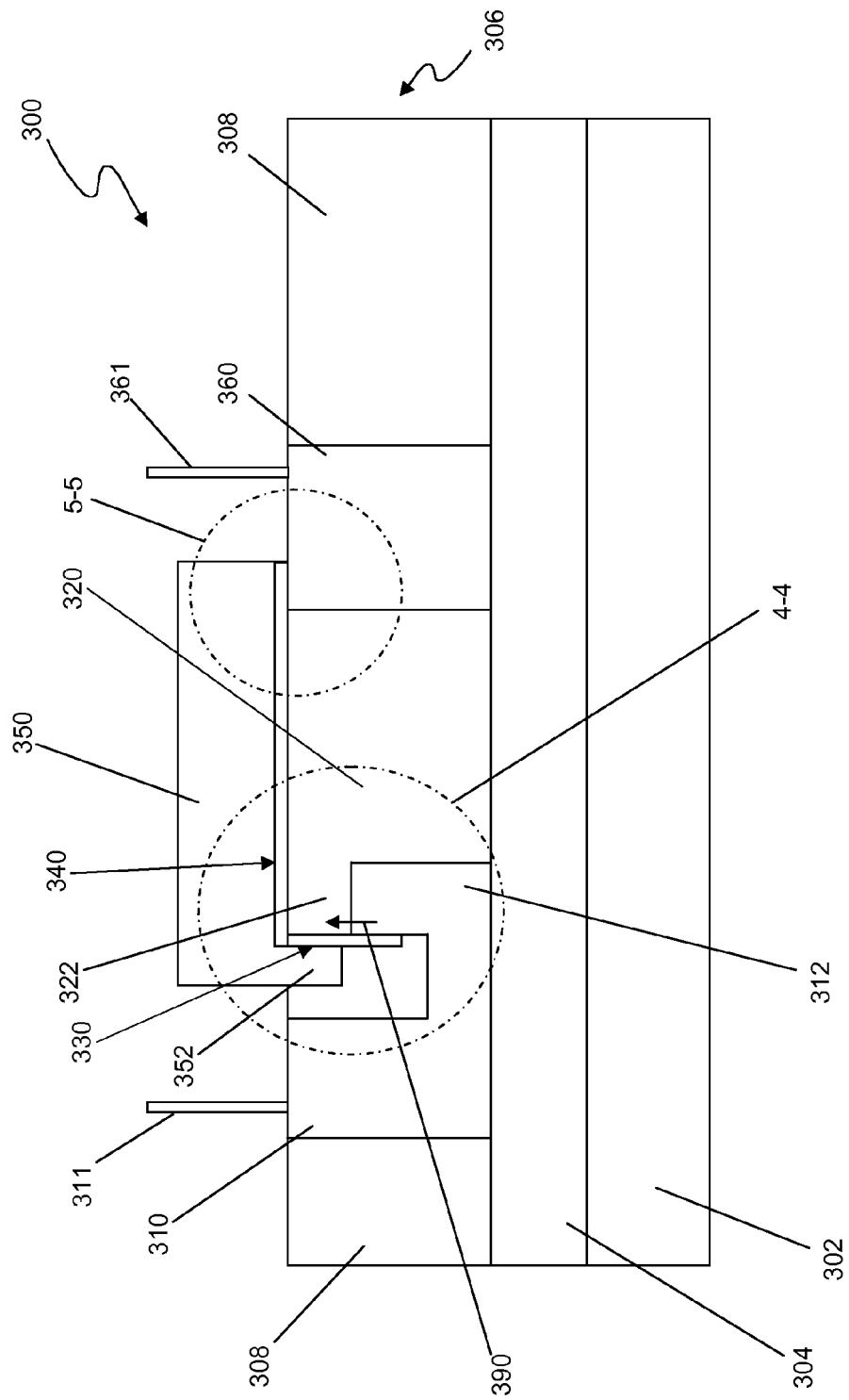
FIG. 3 is a side schematic diagram of a tunnel field effect transistor according to an embodiment.
Figure 4:
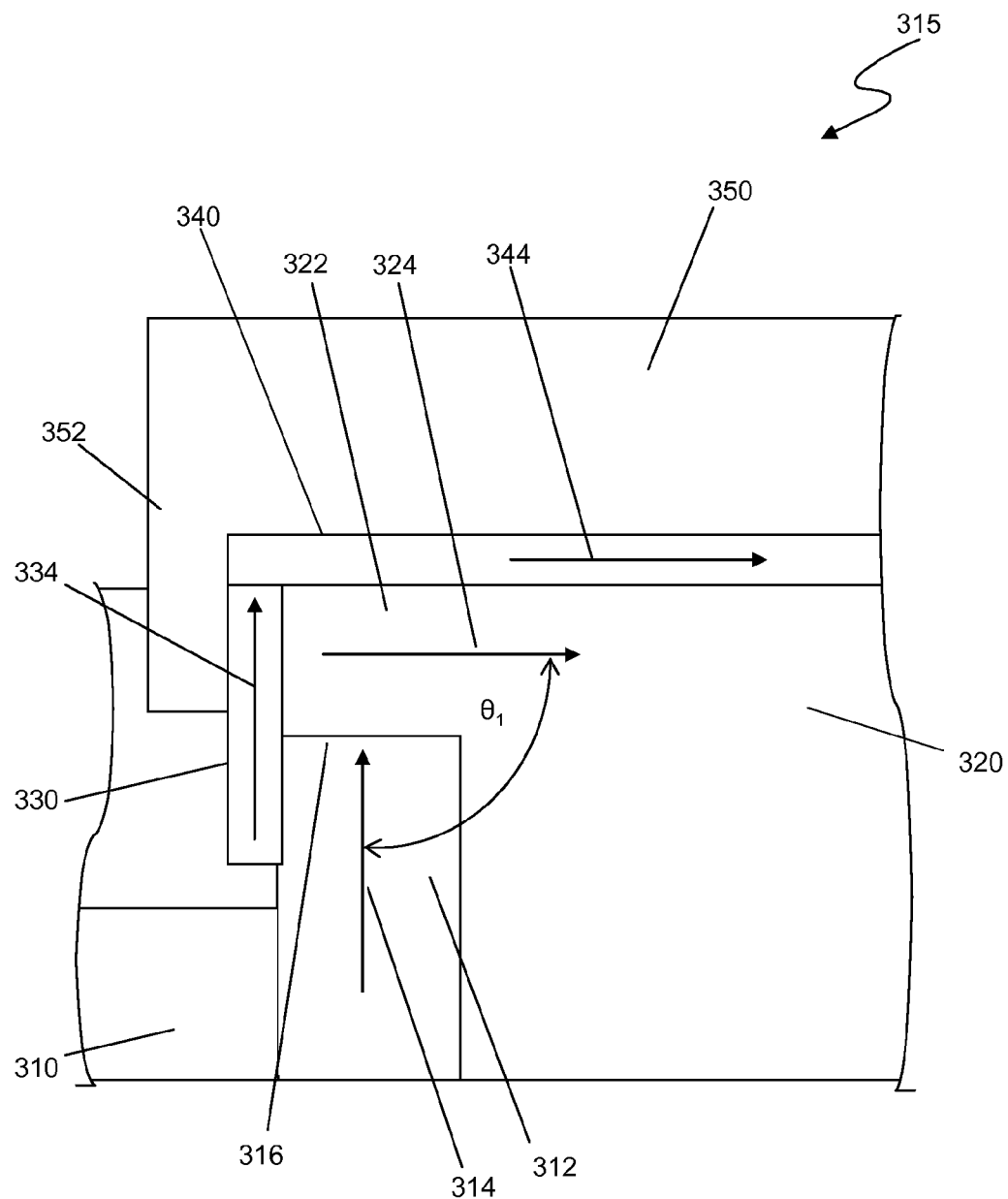
FIG. 4 is a detail of the schematic diagram of a tunnel field effect transistor shown in FIG. 3 taken within the dashed circle labeled 4-4 of FIG. 3.

With particular reference to FIG. 4, source channel-end 312 has a first semiconductor material crystal axis or crystal axis 314. Similarly, channel source-end 322 has a second semiconductor material crystal axis or crystal axis 324. In the example of FIGS. 3-6, again with particular attention to FIG. 4, source region 310 is shown as having a backwards "J" shape or a "U" shape with unequal arms. Source channel-end 312 is shown as an upward-projecting arm of the "U" shaped source region 310 terminating at source-channel junction 316, and first crystal axis 314 is shown in the FIGS. with a particular orientation. An arrangement of source-channel region 315, including orientation of parts included in source-channel region 315, depends on the orientation of first crystal axis 314, in embodiments, so as to increase and/or maximize band-to-band tunneling. First crystal axis 314 here also represents a direction along which source-channel current may be injected. In particular, first crystal axis 314 in embodiments may be oriented at a first predetermined angle $\theta_1$ relative to second crystal axis 324, which angle may be determined by particular materials used to form at least source channel-end 312 and/or channel source-end 322. The tunnel and channel dielectrics in embodiments are also arranged such that they are at a predetermined angle relative to each other. In the example shown in FIGS. 3-5, each of tunnel and channel dielectrics 330, 340 have respective tunnel and channel axes 334, 344, in this case being substantially parallel to first and second crystal axes 314, 324 so that they are separated by first predetermined angle $\theta_1$. Materials used to form gate region 350, tunnel dielectric 330, and/or channel dielectric 340 may also be taken into account to determine the first predetermined angle $\theta_1$.

Figure 5:
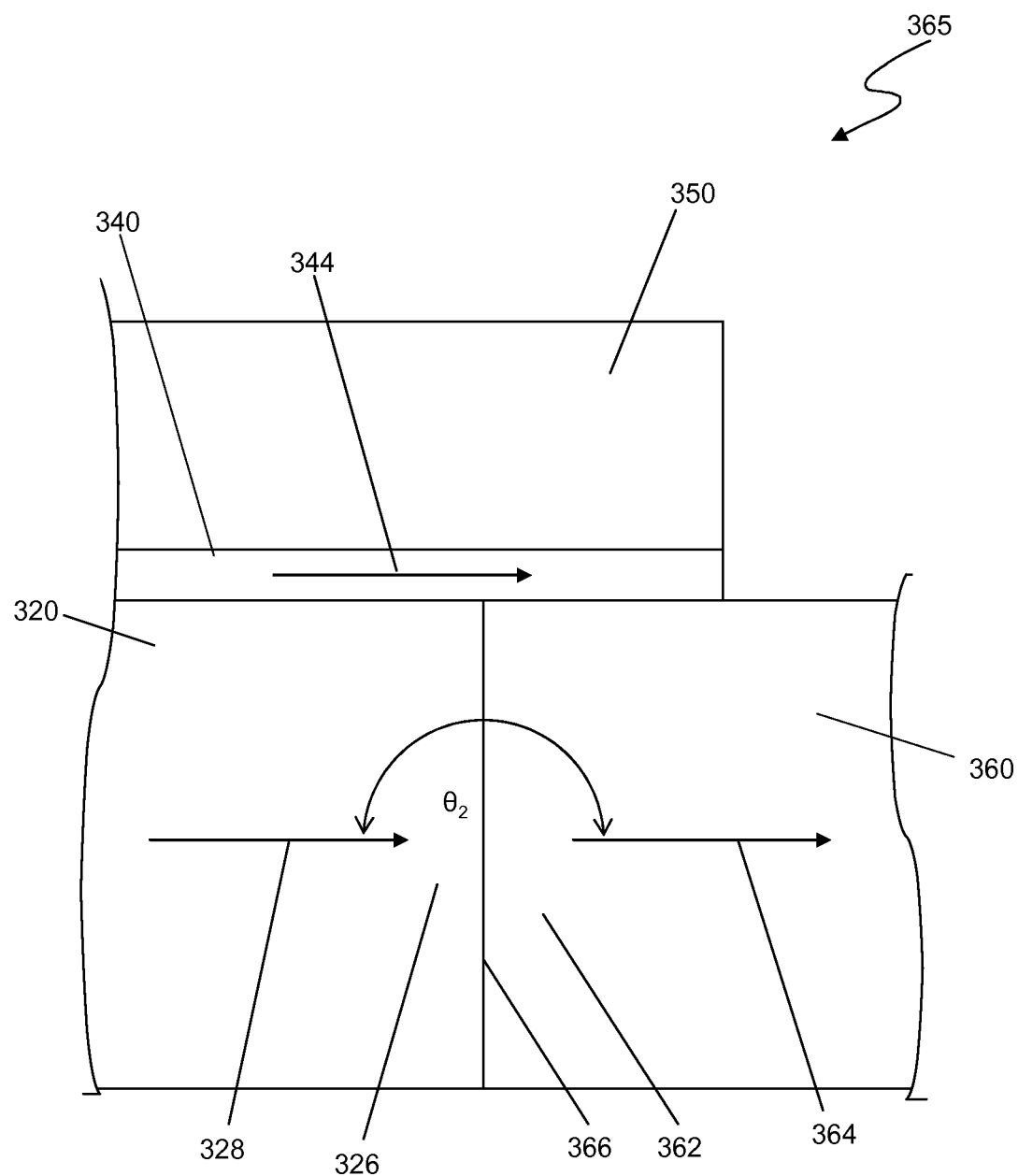
FIG. 5 is a detail of the schematic diagram of a tunnel field effect transistor shown in FIG. 3 taken within the dashed circle labeled 5-5 of FIG. 3.
Figure 6:
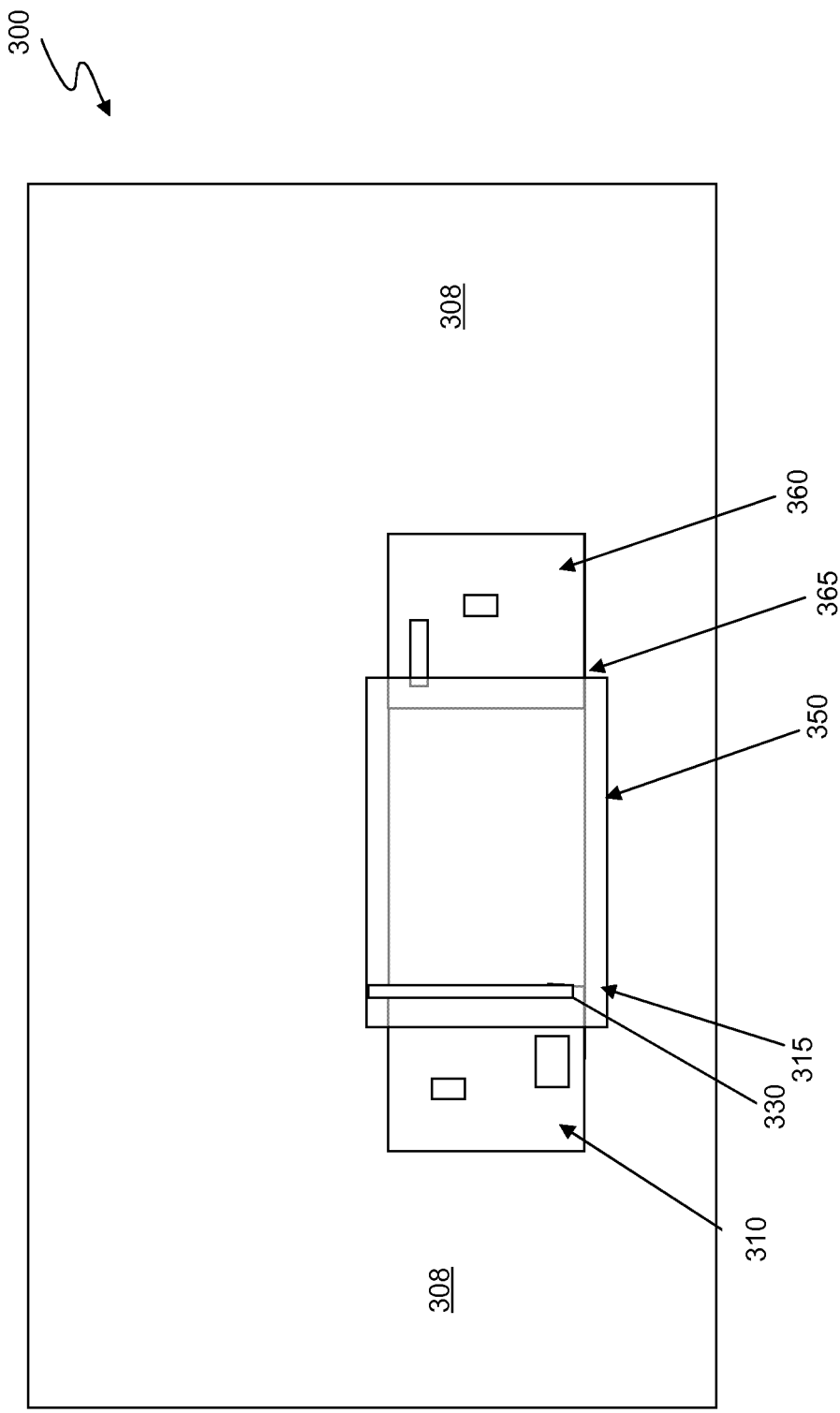
FIG. 6 is a top view of the tunnel field effect transistor according to an embodiment shown in FIG. 3.

For example, for the embodiment shown in FIGS. 3-5, source channel-end 312 and channel source-end 322 may both be made from silicon. Silicon has an Fd-3m space group (number 227) with a diamond structure and cell parameters of a: 543.09 pm, b: 543.09 pm, c: 543.09 pm, α: 90.000°, β: 90.000°, and γ: 90.000°. Using Miller indices, the crystal orientation for silicon may be referred to as [111], and electrons will tend to travel along the [110] orientation since it has the highest electron mobility, suggesting that the source region should be formed from silicon with a [110] crystal orientation. Generally at least a portion of the channel region should have a crystal orientation or axis of [100], [010], or [001] so that electron mobility is low. In the example shown in FIGS. 3 and 4, the source channel-end 312 may be silicon with a first crystal orientation 314 of and the channel source-end 322 may be silicon with a second crystal orientation 324 of [001] so that, to maximize band-to-band tunneling, the first predetermined angle $\theta_1$ should be ninety degrees for the particular exemplary combination of materials and arrangement. In the embodiment shown in FIGS. 3-5, both ends of channel region 320 have the same crystal orientation, but in general the crystal orientation of the one end of the channel region need not the same as the crystal orientation of the other end, as will be described below.

With regard to channel-drain region 365, with particular reference to FIG. 5, channel drain-end 326 is shown as terminating at channel-drain junction 366, and a third semiconductor material crystal axis or crystal axis 328 indicates a direction along which channel-drain current may be injected. In embodiments, channel-drain region 365, particularly channel-drain junction 366, is aligned along third semiconductor material crystal axis 328. A channel-end portion 360 of drain region 360 may have a fourth semiconductor material crystal axis or crystal axis. Third crystal axis 328 in embodiments is oriented at a second predetermined angle $\theta_2$ relative to fourth crystal axis 364, which angle is, as indicated above, selected to reduce or even minimize band-to-band tunneling in the channel-drain region 365. While particular shapes and orientations of components of tunnel field effect transistor 300, such as source-channel region 315 and channel-drain region 365, are shown, they are only examples, and other shapes and alignments may be used within the scope of embodiments. The orientations of components may be determined according to the types of materials used to make them so as to help to form a band to band transfer structure of the transistor through which electrons pass during operation of the device. More specifically, the crystal structure and crystal orientation of a semiconductor determines an appropriate choice of component orientation, according to embodiments. For example, using silicon, third crystal axis 328 of channel drain-end 326 should lie along the [001] in the example shown, as should fourth crystal axis 364 of drain channel-end 362, to minimize band-to-band tunneling and reduce GIDL. In the example of FIGS. 3-5, the entire channel region, or at least both ends 322, 326, may have the same crystal orientation of [001] so that second crystal axis 324 is the same as or at least parallel to third crystal axis 328, and drain region channel-end.

As particularly seen in FIGS. 3 and 4, source region 310 may have a relatively complex shape, with source channel-end 312 projecting from a lower portion of the source region 310. The cross-sectional shape of source region 310 shown in FIGS. 3 and 4 as an example is like a "J" or like a "U" with unequal arms. This shape may be achieved using known techniques, stages of which are shown schematically in FIGS. 7A-7H. For example, using a substrate (7A), semiconductor material may be deposited in a layer 306 until a thickness of the lowest portion of the source region is achieved (7B). After doping source region 310 and drain region 360 (7C), more semiconductor material may be deposited until a thickness of source channel-end 312 is reached (7D). Additional doping may be performed to form drain region 360 and relevant portions of source region 310 (7E). More semiconductor material is deposited until a full body thickness is reached, and more doping source and drain regions 310, 360 may be performed. Source channel-end 312 and channel drain-end 322 result (7F). One or more removal and/or other steps employing known semiconductor device fabrication techniques may be employed to remove body material deposited in the cavity of the "J" or "U" of source region 310, allowing deposition of tunnel dielectric 330, formation of isolation regions 308, and/or deposition of portion 352 of gate region 350 that engages tunnel dielectric 330. Examples of semiconductors that may be employed include silicon and germanium, though others may be used within the scope of the invention. Similarly, silicon dioxide may be used as a dielectric as is customary, but other dielectrics now known and/or later discovered, derived, and/or developed may be used as desired and appropriate.

Figure 8:
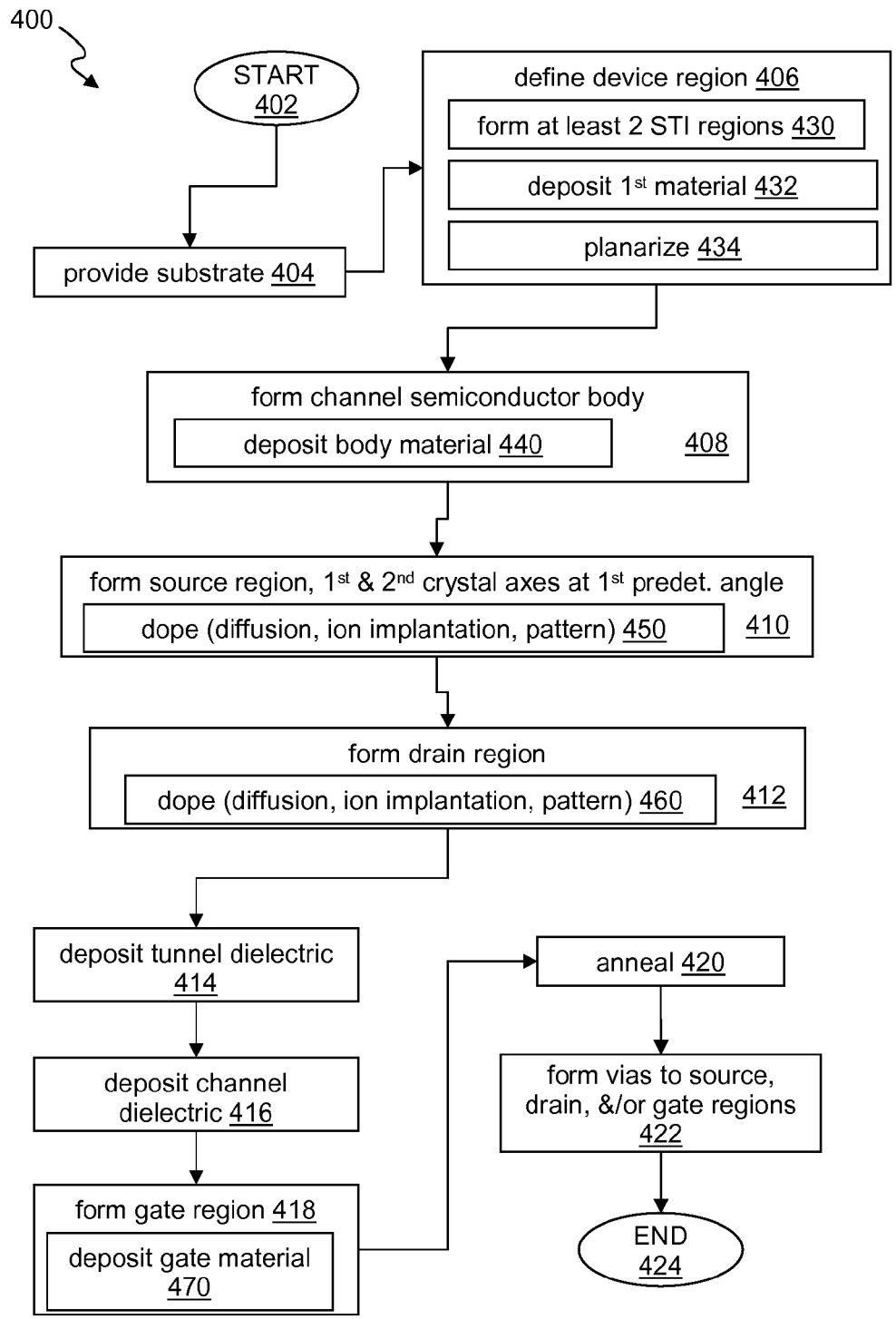
FIG. 8 is a schematic flow diagram of a method of fabricating a tunnel field effect transistor according to an embodiment.

A method of fabricating a tunnel field effect transistor 400 according to embodiments is schematically illustrated in FIG. 8 and starts at start block 402. A substrate, such as a SOI wafer, is provided (block 404), and a device region is defined (block 406). The device region in embodiments is defined using shallow trench isolation to form at least two isolation trenches (block 430), depositing a material in the trenches (block 432), and planarizing the deposited material (block 434). The material deposited in the trenches may be a dielectric, such as silicon dioxide.

A first semiconductor body having a first crystal orientation or first semiconductor material crystal axis may be formed, such as by forming a channel semiconductor body or region (block 408), and a second semiconductor body with a second crystal orientation or second semiconductor material crystal axis may be formed, such as by forming a source region (block 410). The channel and source semiconductor bodies are formed so that the first and second semiconductor material crystal axes are at a predetermined angle relative to each other (block 410). A drain region is formed (block 412) and in an embodiment may include a third drain semiconductor body having a third semiconductor crystal axis that may be at a predetermined angle relative to the second semiconductor material crystal axis. The channel region and semiconductor body may be formed by depositing body material (block 440) and by the formation of the source and drain regions. The source and drain regions may be formed using doping (blocks 450, 460), such as ion implantation, diffusion, or other suitable techniques.

Tunnel and channel dielectrics are deposited (blocks 414 and 416), such as by depositing silicon dioxide, and a gate region is formed (block 418). The components are annealed (block 420), and vias to the source, drain, and/or gate regions may be formed (block 422) before the method ends at block 424. The materials disclosed and techniques employed herein are examples, and other materials and techniques now known or later discovered or developed may be employed as appropriate within the scope of the present invention.

Figure 9:
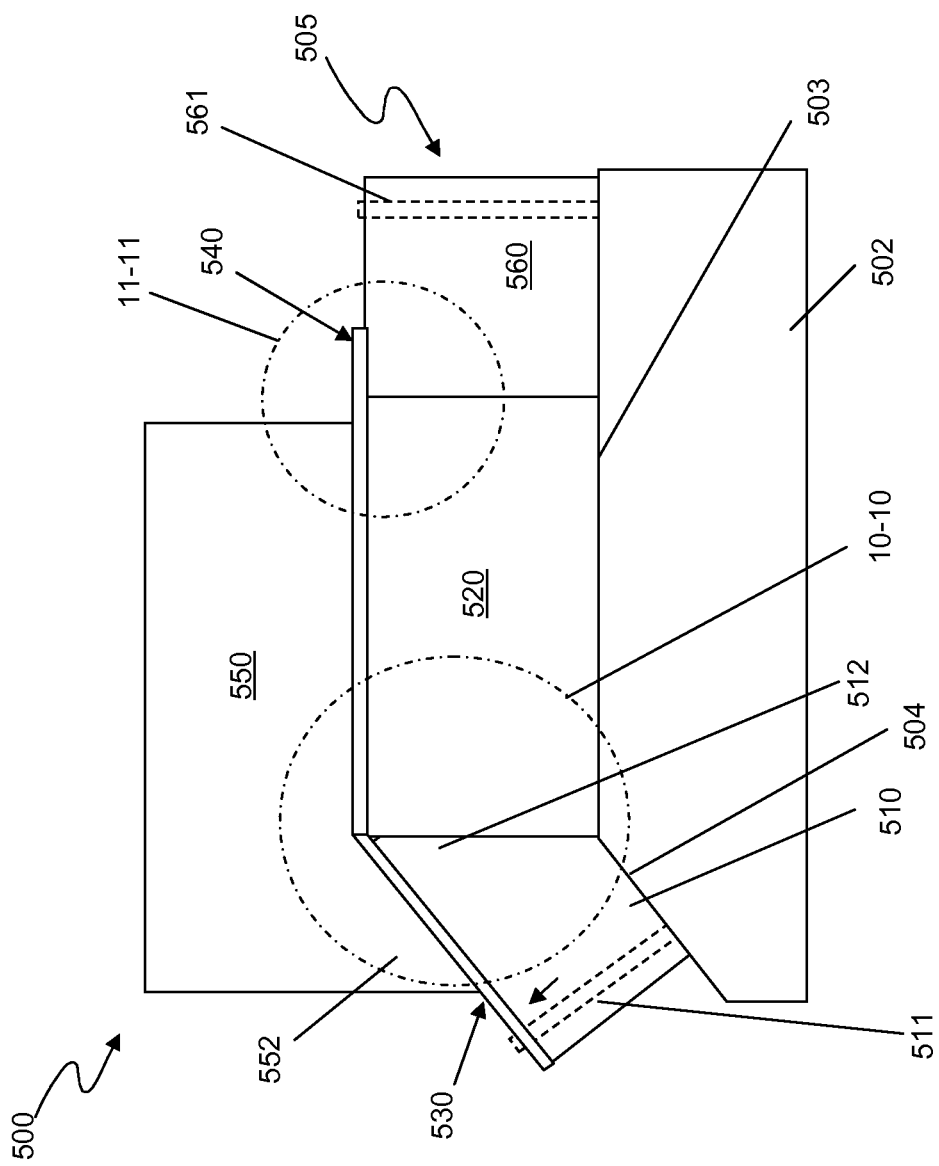
FIG. 9 is a schematic diagram of a tunnel field effect transistor according to an embodiment.
Figure 10:
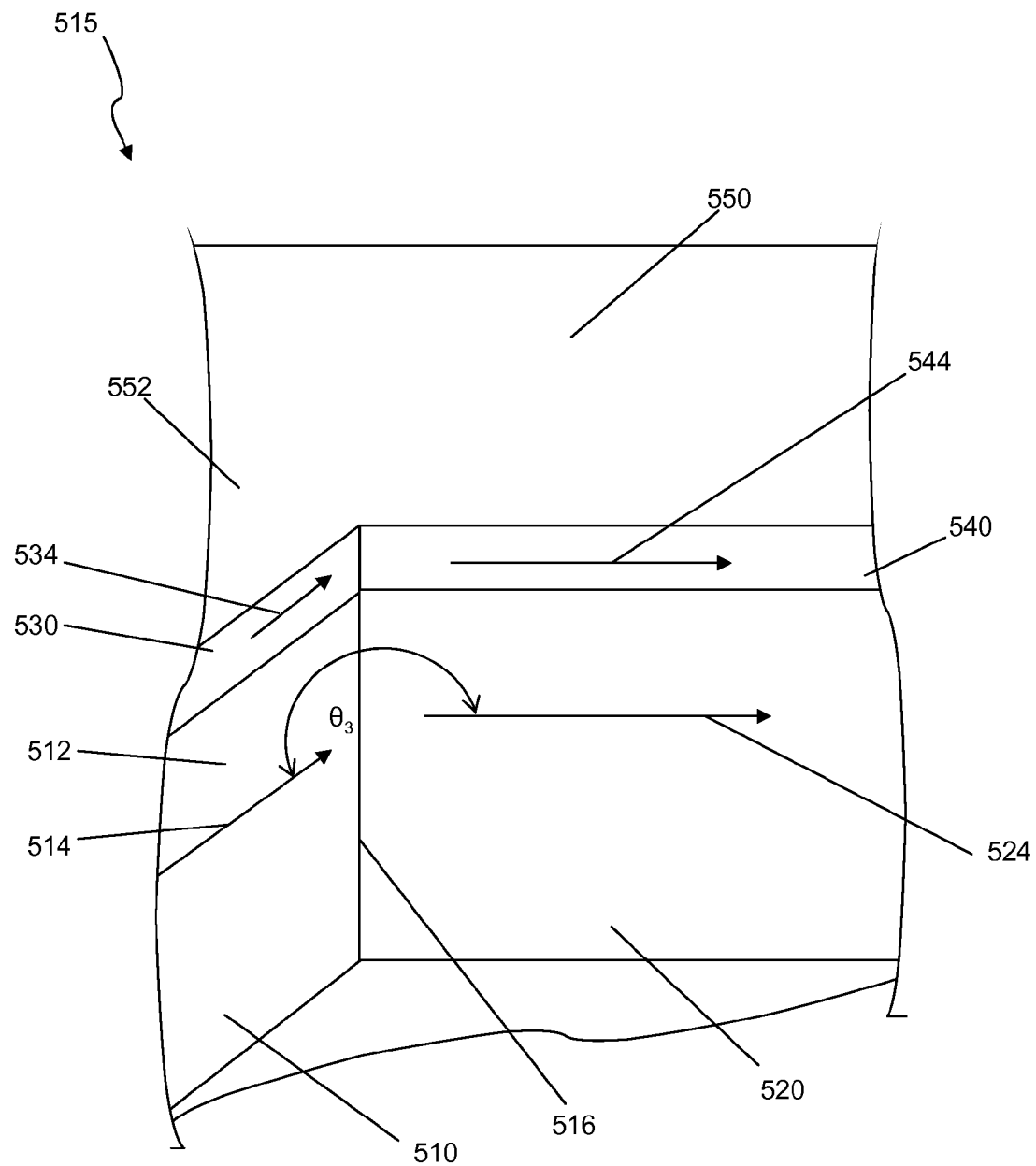
FIG. 10 is a detail of the schematic diagram of a tunnel field effect transistor shown in FIG. 9 taken within the dashed circle labeled 10-10 of FIG. 9.

Another example of an embodiment of the invention as a finFET is shown in FIGS. 9-13C. As with the previous example, a tunnel field effect transistor 500 includes a source region 510, a channel region 520, a gate region 550, and a drain region 560. Transistor 500 may be supported by a substrate 502 with a work surface 503. In an embodiment, substrate 502 also includes a source surface 504 formed at an angle to the work surface. Source, drain, and channel regions 510, 560, 520 are on a fin 505 on work and source surfaces 503, 504. As seen particularly in FIG. 10, source region 510 includes a source channel-end portion 512. Channel region 520 may include a channel drain-end portion 522 in the vicinity of the source channel-end 512. Source channel-end 512 has a first crystal orientation or first semiconductor material crystal axis 514, as shown in FIG. 10, while channel source-end 522 has a second crystal orientation or second semiconductor material crystal axis 524. Source region 510, via source channel-end 512, abuts channel source-end 522 to form a source-channel junction 516 so that first crystal axis 514 is oriented at a first predetermined angle $\theta_3$ relative to second crystal axis 524. For example, as shown in FIGS. 9-13C, where source region and channel region are both silicon, the source channel-end 512 first crystal axis 514 may be along the [110] orientation and the channel source-end 522 may also be along the [110] axis, and the first predetermined angle $\theta_3$ may be forty-five, one-hundred thirty-five, or two-hundred twenty-five degrees.

As particularly seen in FIG. 10, a tunnel dielectric 530 and a channel dielectric 540 separate a gate region 430 from source and channel regions 510, 520. Tunnel dielectric 530 extends along a surface of source region 510, and channel dielectric 540 extends along surfaces of channel and drain regions 520, 560. Tunnel and channel dielectrics 530, 540 have substantially parallel, spaced-apart surfaces and respective tunnel and channel axes 534, 544 substantially parallel to a respective surface of each of source region 510 and channel region 520. The ends of tunnel and channel dielectrics 530, 540 abut so that tunnel and channel axes 534, 544 are at a predetermined angle relative to each other. The angle between tunnel and channel axes 534, 544 may be the same as the angle between first and second semiconductor material crystal axes 514, 524 in embodiments. As seen in FIG. 7, vias 511, 561 allow access to source and drain regions 510, 560, such as to provide connections to power sources.

Figure 11:
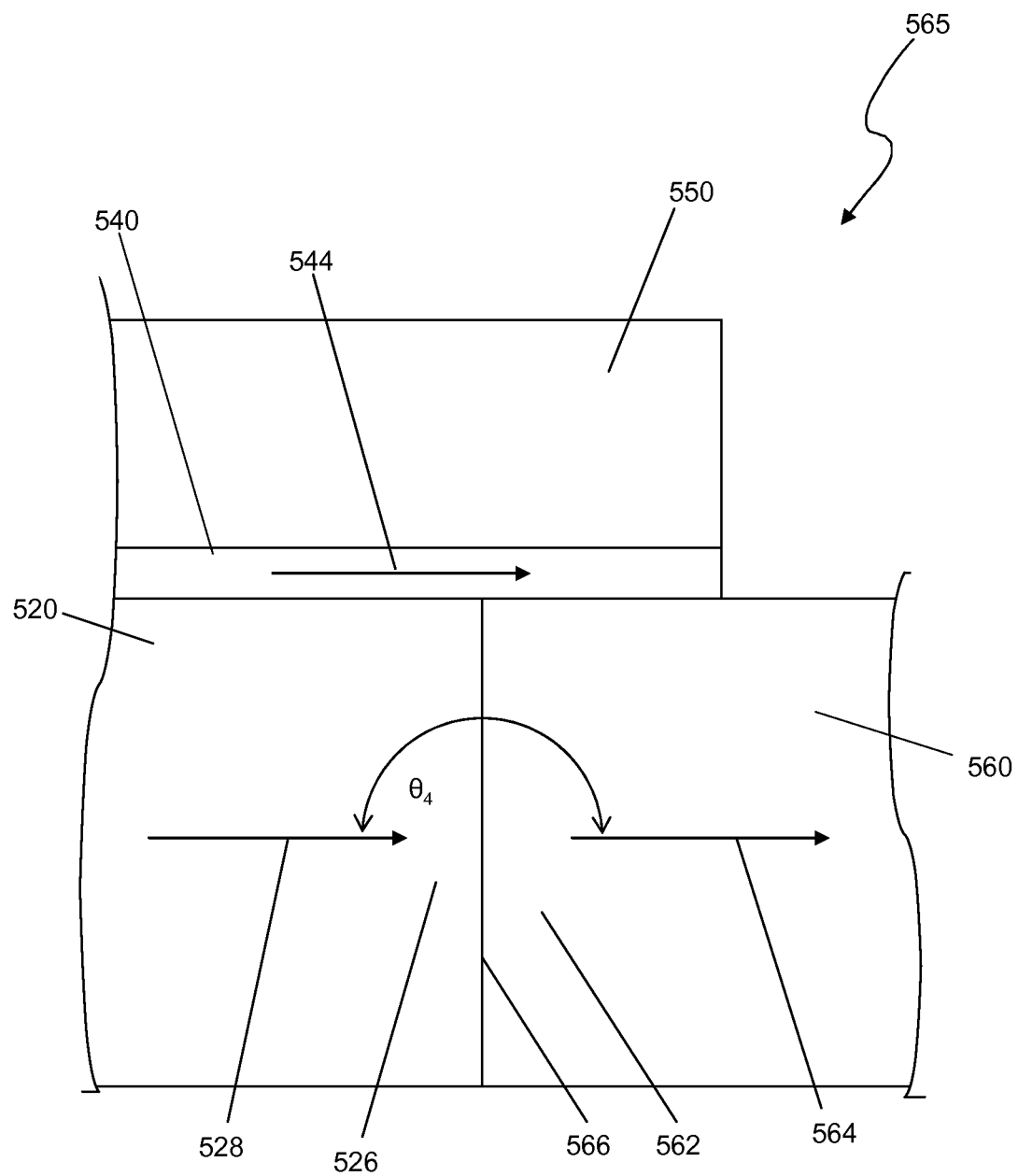
FIG. 11 is a detail of the schematic diagram of a tunnel field effect transistor shown in FIG. 9 taken within the dashed circle labeled 11-11 of FIG. 9.

With regard to channel-drain region 565, with particular reference to FIG. 11, channel drain-end 526 is shown as terminating at channel-drain junction 566, and a third semiconductor material crystal axis or crystal axis 528 indicates a direction along which channel-drain current may be injected. In embodiments, channel-drain region 565, particularly channel-drain junction 566, is aligned along third semiconductor material crystal axis 528. A drain channel-end portion 562 of drain region 560 may have a fourth semiconductor material crystal axis or crystal axis 564. Third crystal axis 528 in embodiments is oriented at a second predetermined angle $\theta_4$ relative to fourth crystal axis 564. As indicated above, the crystal orientation of the bodies in the channel-drain region 565 should be selected for low electron mobility to reduce or minimize GIDL. In silicon, the orientation should be selected from the [100], [010], or [001] orientations, and the third and fourth crystal orientations should be parallel. For example, where channel drain-end 526 third crystal axis 528 is along the [100] axis, fourth crystal axis 564 may be along the [100] axis and at a zero, one-hundred eighty, or three-hundred sixty degree angle relative to third crystal axis 528 to minimize GIDL. In the embodiment shown in FIGS. 9-11, channel region 520 has a crystal orientation of [110] at source-end 522 and a crystal orientation of [100] or [010] at drain-end 526 to yield high band-to-band tunneling at source-channel region 525 and low band-to-band tunneling at channel-drain region 565. While particular shapes and orientations of components of tunnel field effect transistor 500, such as source-channel region 515 and channel-drain region 565, are shown, they are only examples, and other shapes and alignments may be used within the scope of embodiments. The orientations of components may be determined according to the types of materials used to make them so as to help to form a band to band transfer structure of the tunnel field effect transistor through which electrons pass during operation of the device. More specifically, the crystal structure of a semiconductor determines an appropriate choice of component orientation, according to embodiments.

Figure 12A:
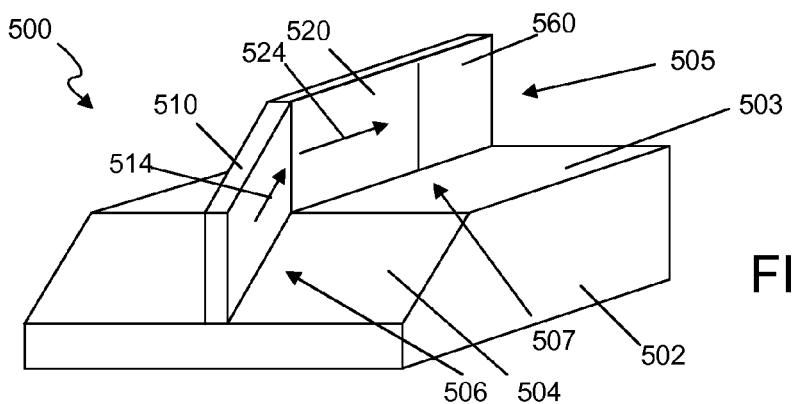
FIGS. 12A-12C schematically illustrate stages of fabrication of a tunnel field effect transistor, such as that shown in FIGS. 9-11, according to an embodiment.
Figure 12B:
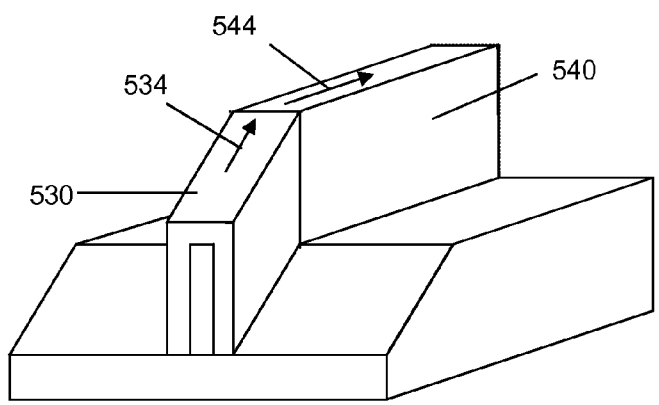
Figure 12C:
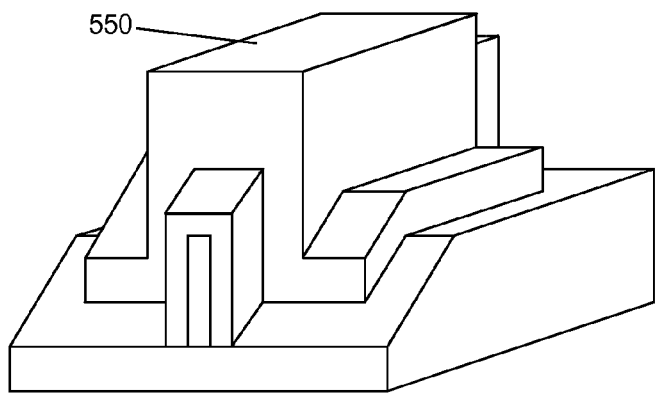

In embodiments, the example shown in FIGS. 9-11 is a cross-section of a finFET formed as illustrated in FIGS. 12A-12C. FIG. 12A shows the substrate 502 with the work surface 503 and the source surface 504 at an angle to the work surface 503. In FIG. 12A, the fin 505 is formed and source, drain, and channel regions 510, 560, 520 are defined. Fin 505 of embodiments includes a source fin 506 on source surface 506 and a work fin 507 on work surface 503. Source and work fins 506, 507 may be formed in one step or may be formed in two or more steps, depending on the particular materials and requirements of the tunnel field effect transistor. First and second semiconductor material crystal axes 514, 524 are also shown in FIG. 12A. FIG. 12B shows tunnel and channel dielectrics 530, 540 formed over fin 505, and indicates the relationship of tunnel and channel axes 534, 544. FIG. 12C shows deposited gate region 520.

Figure 13A:
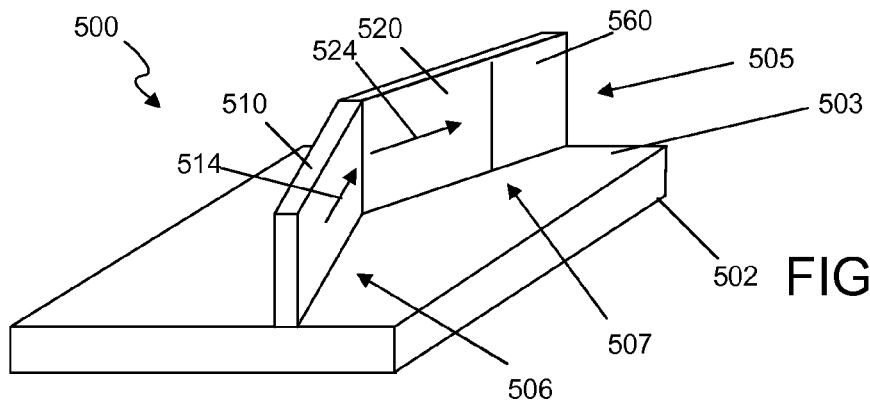
FIGS. 13A-13C schematically illustrate stages of fabrication of a tunnel fin-transistor, such as that shown in FIGS. 9-11, according to an embodiment.
Figure 13B:
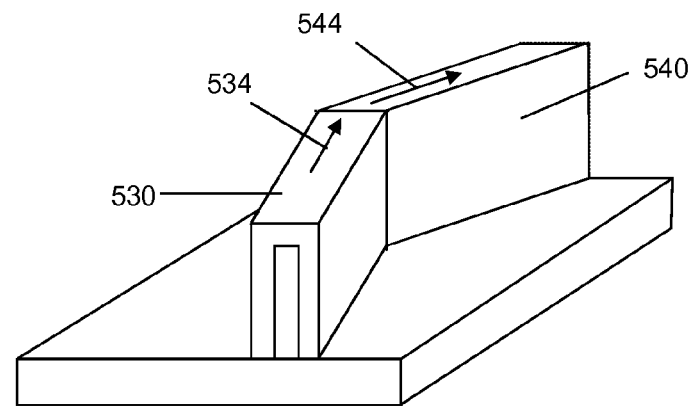
Figure 13C:
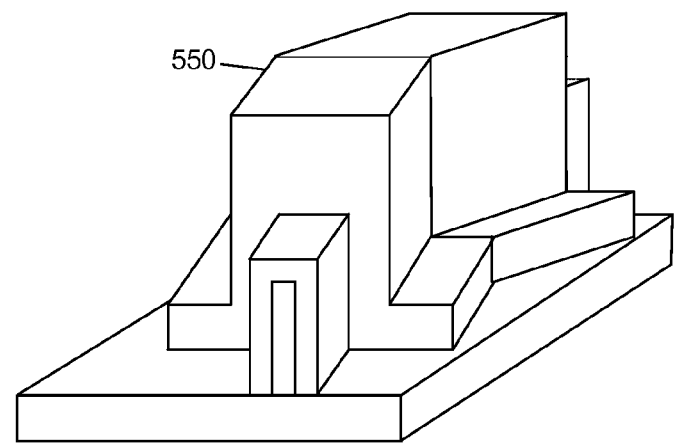

Alternatively, the example shown in FIGS. 9-11 can be seen as a top schematic view, in which case substrate 502 would simply have a work surface 503. This is schematically illustrated in FIGS. 13A-13C. The stages shown in FIGS. 13A-13C are much like those of FIGS. 12A-12C, but source fin 506 and work fin 507 are formed on the same plane, such as work surface 503. In all examples above and below provided in conjunction with the disclosure of embodiments of the present invention, including, but not limited to, the alternative example shown in FIGS. 9-11, the materials disclosed and techniques employed are examples, and other materials and techniques now known and/or later discovered, derived, and/or developed may be employed as appropriate within the scope of the present invention.

Figure 14:
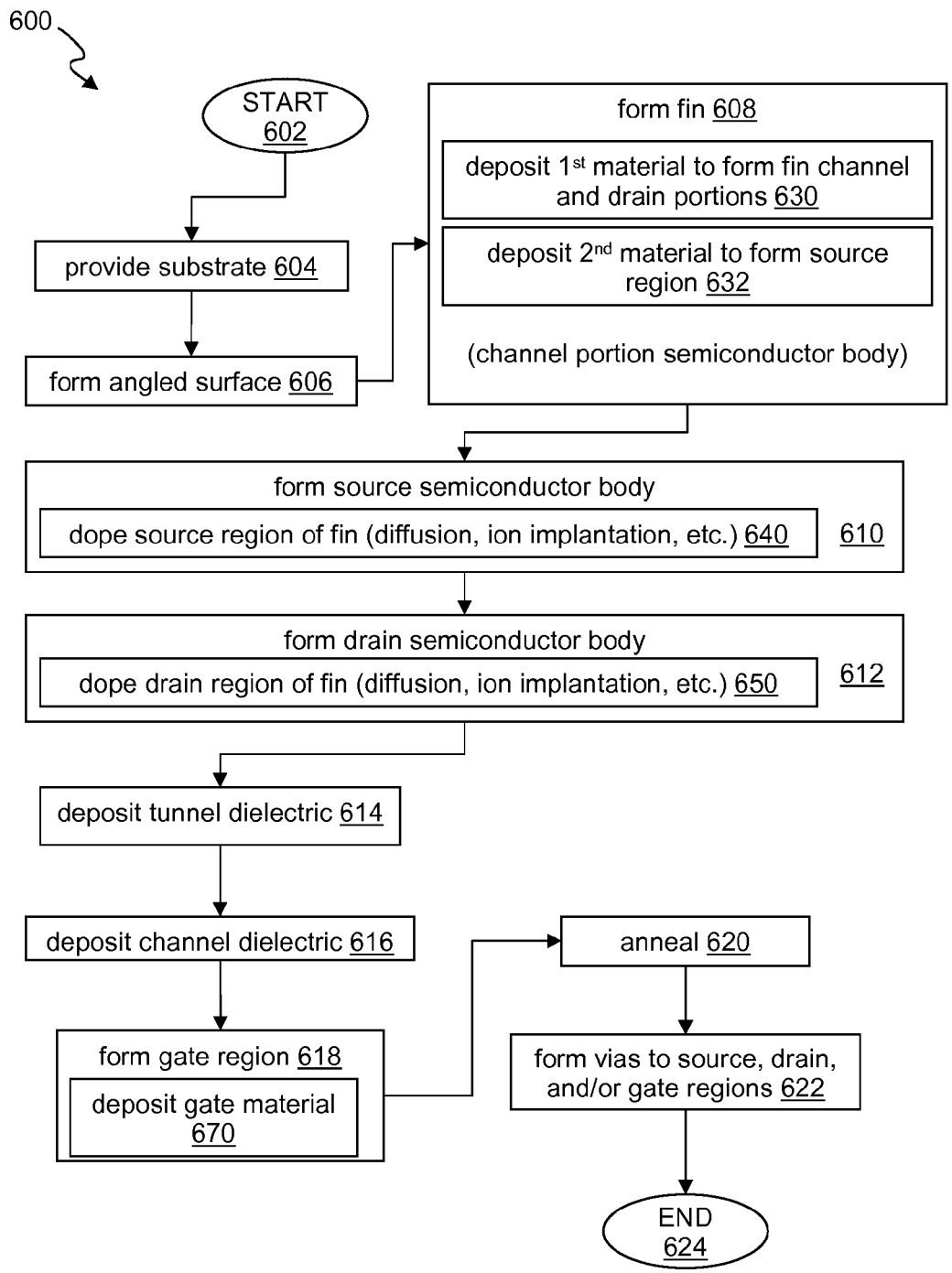
FIG. 14 is a schematic flow diagram of a method of fabricating a tunnel fin-field effect transistor according to an embodiment.

As seen in FIG. 14, an example of a method of fabricating a tunnel field effect transistor 600 according to embodiments starts at start block 602. A substrate is provided (block 604), and an angled surface, such as source surface 504 above, is formed, if required (block 606). A fin is formed (block 608) including at least channel and drain portions, the channel portion being a channel semiconductor body, such as a channel source-end, with a respective crystal orientation or semiconductor material crystal axis, such as along a source-channel junction. A source region is formed (block 610) and has a source semiconductor body, such as a source channel-end, including a respective crystal orientation or semiconductor material crystal axis, such as along a channel-drain junction, at a predetermined angle to the channel source-end crystal orientation. A drain region is formed (block 612) and in an embodiment includes a drain semiconductor body, such as a drain channel-end, having a respective crystal orientation or semiconductor material crystal axis that may be at another predetermined angle relative to a channel drain-end crystal orientation or semiconductor material crystal axis. Tunnel and channel dielectrics are deposited (blocks 514 and 516), and a gate region is formed (block 618). Annealing is performed (block 620) and vias to the source, drain, and/or gate regions are formed (block 622). The method ends at block 624.

In forming the fin (block 608), the method may include depositing a first material to form the fin channel and drain portions (block 630) and depositing a second material to form the source region (block 632). Forming the source and drain semiconductor bodies may include doping the source and drain regions of the fin (blocks 540, 550), and the gate region may be formed by depositing a gate material (block 670) over the fin. Doping may be accomplished by, for example, diffusion, ion implantation, pattern doping, or other techniques as may be appropriate and/or desired. The materials disclosed and techniques employed herein are examples, and other materials and techniques now known or later discovered or developed may be employed as appropriate within the scope of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A tunnel field effect transistor comprising:
   a source region, a channel region, a gate region, and a drain region, the channel region being connected to the source region and the drain region;
   a first semiconductor body of one of the source region, the channel region, and the drain region, the first semiconductor body having a first semiconductor material crystal axis; and
   a second semiconductor body of another of the source region, the channel region, and the drain region, the second semiconductor body having a second semiconductor material crystal axis; and
   a first transition region including at least a first junction that is a respective one of a source-channel junction and a channel-drain junction, the first semiconductor body and the second semiconductor body being arranged such that the first semiconductor material crystal axis is oriented at a first predetermined angle relative to the second semiconductor material axis to optimize band-to-band tunneling during operation of the tunnel field effect transistor.

2. The tunnel field effect transistor of claim 1, wherein the first predetermined angle between the first semiconductor material crystal axis and the second semiconductor material crystal axis is determined at least in part by a material used to make at least one of the first semiconductor body and the second semiconductor body.

3. The tunnel field effect transistor of claim 1, wherein the first and second semiconductor bodies are silicon and the first predetermined angle between the first and second semiconductor material crystal axes is ninety degrees.

4. The tunnel field effect transistor of claim 1, wherein the first and second semiconductor bodies are silicon and the first predetermined angle between the first and second semiconductor material crystal axes is one-hundred thirty-five degrees.

5. The tunnel field effect transistor of claim 1, further comprising:
   a tunnel dielectric extending along at least portions of surfaces of the source and channel regions, the tunnel dielectric having a tunnel axis substantially parallel to one of the first and second semiconductor material crystal axes; and
   a channel dielectric extending along at least portions of surfaces of the channel and drain regions, the channel dielectric having a channel axis substantially parallel to the other of the first and second semiconductor material crystal axes.

6. The tunnel field effect transistor of claim 1, wherein the transition region is a source-channel region configured to maximize band-to-band tunneling.

7. The tunnel field effect transistor of claim 1, wherein the transition region is a channel-drain region configured to minimize band-to-band tunneling.

8. The tunnel field effect transistor of claim 1, wherein the source, channel, and drain regions are part of a fin of semiconductor material deposited on a substrate.

9. The tunnel field effect transistor of claim 1, further comprising a substrate with a source surface and a work surface, the source surface and work surface meeting at an angle that imposes the first predetermined angle between the first and second semiconductor material crystal axes.

10. A method of fabricating a tunnel field effect transistor on a semiconductor substrate, the method comprising:
    providing a semiconductor substrate;
    defining a device region;
    forming a channel semiconductor body in the device region with a source-end portion, a drain-end portion, and at least one gate surface; and
    forming one of a source region and a drain region, thereby forming a junction, including forming a channel-end portion adjacent a respective channel end portion, the channel-end portion of the one of a source region and a drain region having a first semiconductor material crystal axis, the respective channel end portion having a second semiconductor material crystal axis oriented at a first predetermined angle relative to the first semiconductor material crystal axis so as to optimize band-to-band tunneling at the junction during operation of the tunnel field effect transistor.

11. The method of claim 10, wherein the forming one of a source region and a drain region includes forming a source region, the forming a channel-end portion includes forming a source channel-end portion adjacent the channel source-end portion, the junction is a source-channel junction, the first predetermined angle is determined so as to maximize band-to-band tunneling at the source-channel junction during operation of the tunnel field effect transistor.

12. The method of claim 11, further comprising:
    forming a drain region, thereby forming a channel-drain junction, including forming a drain channel-end portion adjacent the channel drain-end portion, the drain channel-end portion having a third semiconductor material crystal axis, the channel drain-end portion having a fourth semiconductor material crystal axis oriented at a second predetermined angle relative to the third semiconductor material crystal axis so as to minimize band-to-band tunneling at the junction during operation of the tunnel field effect transistor.

13. The method of claim 12, including forming the channel-drain junction such that the third semiconductor material crystal axis is parallel to the second semiconductor material crystal axis.

14. The method of claim 10, wherein the forming the channel region and the forming one of a source region and a drain region include forming the channel-end portion and the respective channel end portion from silicon such that the first predetermined angle is ninety degrees.

15. The method of claim 10, wherein the forming one of a source region and a drain region includes forming a drain region, the forming a channel-end portion includes forming a drain channel-end portion adjacent the channel drain-end portion, the junction is a source-channel junction, and the first predetermined angle is determined so as to minimize band-to-band tunneling at the source-channel junction during operation of the tunnel field effect transistor including forming a channel-drain junction, the channel drain-end portion having a third semiconductor material crystal axis, and the drain channel-end portion having a fourth semiconductor material crystal axis oriented at a second predetermined angle relative to the third semiconductor material crystal axis.

16. A method of making a tunnel field effect transistor comprising:
    providing a substrate having a work surface;
    forming a fin on the work surface;
    forming a source region of the fin, the source region having a channel-end portion with a first semiconductor material crystal axis;
    forming a channel region of the fin adjacent the source region, thereby forming a source-channel junction between the source region and the channel region, a source-end portion of the channel region having a second semiconductor material crystal axis that is oriented at a first predetermined angle relative to the first semiconductor material crystal axis, the first predetermined angle being determined to maximize band-to-band tunneling of the source-channel junction during operation of the tunnel field effect transistor;
    depositing a tunnel dielectric on at least a portion of the source region of the fin;
    depositing a channel dielectric on at least a portion of the channel region of the fin; and
    forming a gate region by depositing gate material on the tunnel and channel dielectrics.

17. The method of claim 16, further comprising forming a drain region of the fin with a drain channel-end portion adjacent a channel drain-end portion of the channel, thereby forming a channel-drain junction, the channel drain-end portion having a third semiconductor material crystal axis, and the drain channel-end portion having a fourth semiconductor material crystal axis oriented at a third predetermined angle relative to the third semiconductor material crystal axis, the third predetermined angle being determined to minimize band-to-band tunneling at the channel-drain junction.

18. The method of claim 16, wherein the forming a fin includes depositing semiconductor material on the work surface oriented along the first semiconductor material crystal axis and depositing semiconductor material oriented along the second semiconductor material crystal axis.

19. The method of claim 16, further comprising forming a source surface at an angle to the work surface and wherein the first predetermined angle between the first and second semiconductor material crystal axes is imposed by the angle at which the source surface is formed relative to the work surface.

20. The method of claim 16, wherein the forming a fin includes:
   forming a source fin with the first crystal orientation and the first semiconductor material crystal axis; and
   forming a work fin with the second crystal orientation and the second semiconductor material crystal axis, an end of the work fin meeting an end of the source fin.

* * * * *